United States Patent [19]

Denny

[11] Patent Number: 4,544,217

[45] Date of Patent: Oct. 1, 1985

[54] EJECTOR LATCH

[75] Inventor: Alan Denny, Fountain Valley, Calif.

[73] Assignee: Management Assistance, Inc., Tustin, Calif.

[21] Appl. No.: 658,145

[22] Filed: Oct. 5, 1984

[51] Int. Cl.⁴ .............................................. H05K 1/00
[52] U.S. Cl. ............................... 339/17 M; 339/45 M; 339/91 R
[58] Field of Search ........... 339/45, 46, 91 R, 17 LM, 339/17 M

[56] References Cited

U.S. PATENT DOCUMENTS

| | | | |
|---|---|---|---|
| 3,181,906 | 5/1965 | Rose et al. | 339/45 M |
| 3,609,547 | 9/1971 | Slusser | 339/45 M |
| 3,631,380 | 12/1971 | Bohn | 339/17 LM |
| 3,771,100 | 11/1973 | Reed | 339/17 M |
| 3,846,732 | 11/1974 | Labride et al. | 339/17 LM |
| 4,133,592 | 1/1979 | Cobaugh et al. | 339/17 M |
| 4,168,877 | 9/1979 | Little et al. | 339/91 R |
| 4,480,885 | 11/1984 | Coppelman | 339/45 M |

Primary Examiner—Gil Weidenfeld
Assistant Examiner—David L. Pirlot
Attorney, Agent, or Firm—Amster Rothstein & Engelberg

[57] ABSTRACT

An ejector latch which attaches to electrical circuit boards to be stacked in a cabinet and which secures the circuit boards in a stack so that the circuit boards are maintained in electrical interconnection. The ejector latch allows one circuit board or a number of circuit boards to be easily removed from the stack simultaneously.

2 Claims, 8 Drawing Figures

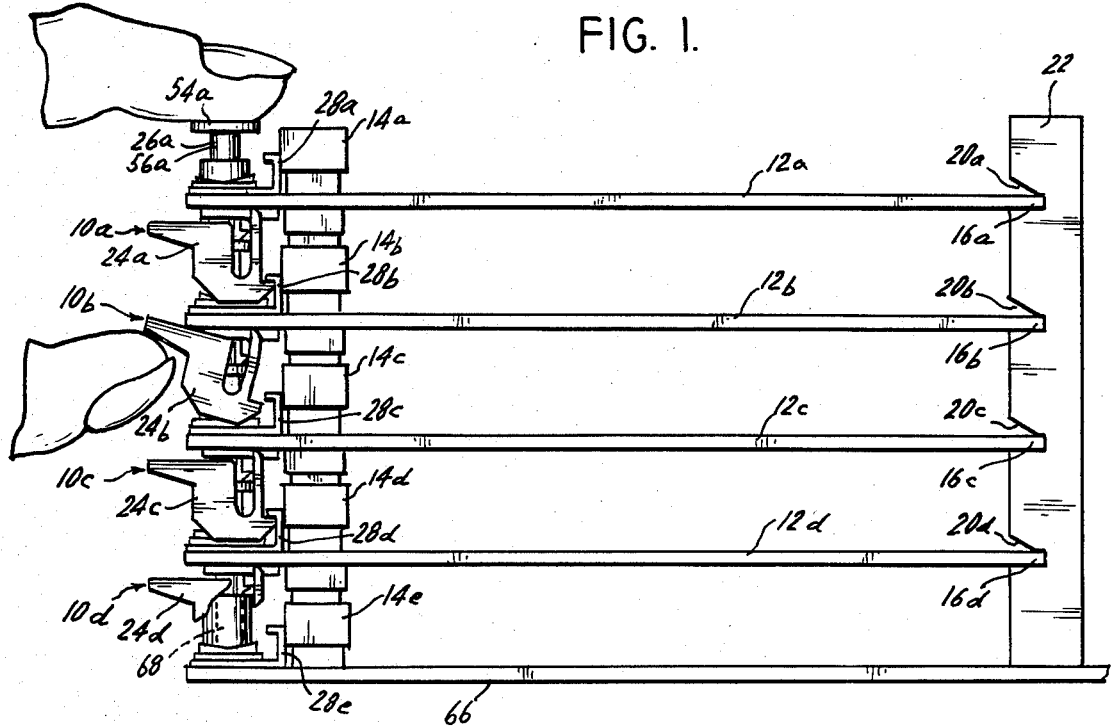
FIG. 1.
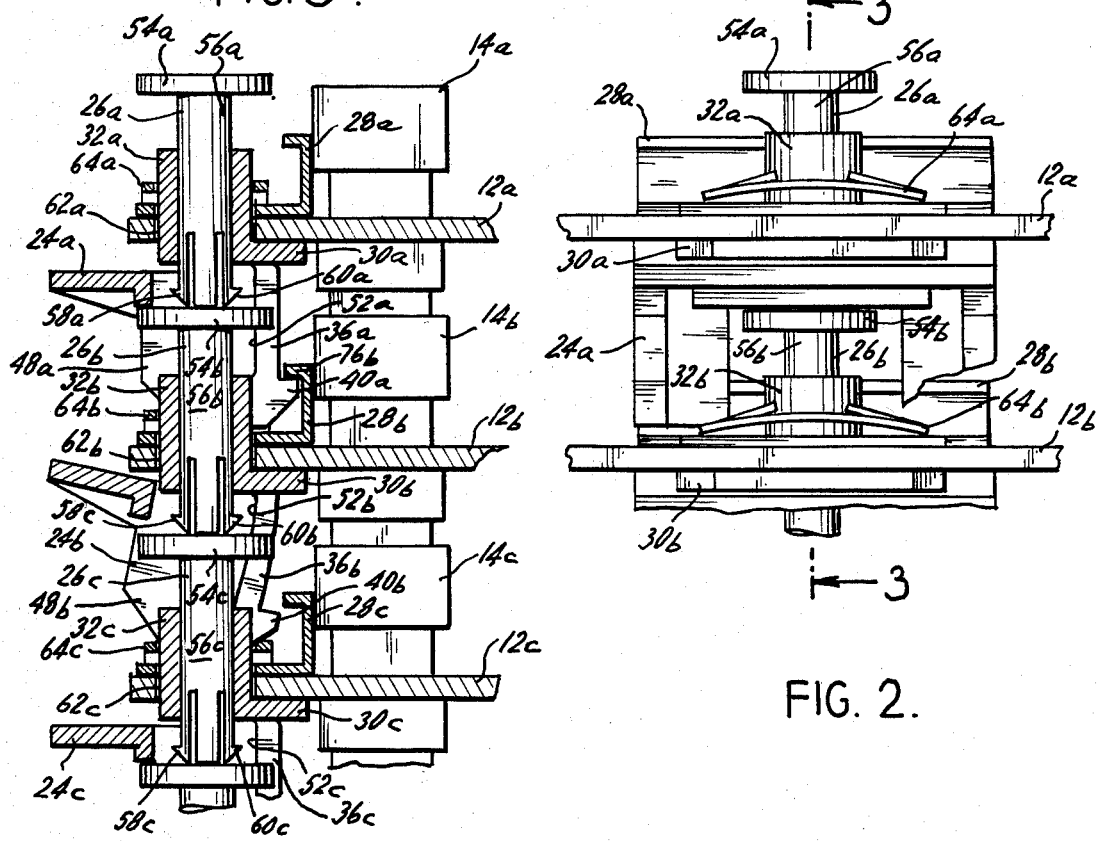
FIG. 3.
FIG. 2.

EJECTOR LATCH

BACKGROUND OF THE INVENTION

The invention generally relates to a latch device which permits circuit boards to be stacked in a cabinet while allowing easy removal of the boards from the cabinet either one at a time or in groups of two or more boards.

Devices for stacking circuit boards are well-known in the prior art. Examples of such devices are disclosed in U.S. Pat. Nos. 4,297,769; 3,893,208; 3,852,849; 3,836,703; 3,811,154; 3,777,052 and 3,688,635.

In U.S. Pat. No. 3,836,703 a one-piece spacer support for circuit boards is provided which includes a main body with a lower end comprising flexible locking fingers. The flexible locking fingers are inserted into an aperture in a circuit board where they compress to a diameter smaller than the aperture in the circuit board and then expand once pressed through the aperture to fix the spacer support to a circuit board. The upper end of the main body section has a frame structure with an aperture to allow a second circuit board to be laid over the top end of the spacer support and be similarly locked in place with a second spacer support. Removal of one circuit board from another held together by the spacer supports is difficult since it requires compressing the flexible fingers on each one of the spacer supports and disengaging each of the spacer supports until the circuit board is free.

U.S. Pat. No. 3,893,208 discloses a spacer support, similar to the spacer support disclosed in U.S. Pat. No. 3,836,703, including locking fingers which yieldingly bend when inserted through an aperture in a circuit board to secure one circuit board to another. The locking fingers are formed of "non-return" material and thus do not allow for circuit boards to be engaged and disengaged from one another without the installation of new spacer supports.

None of the prior art devices provide mechanisms for easily removing and replacing circuit boards or allowing for a number of circuit boards to be removed simultaneously.

OBJECTS AND SUMMARY OF THE INVENTION

It is an object of the present invention to overcome these deficiencies in the prior art.

It is a general object of the present invention to provide a latch device that easily attaches to a circuit board and is adapted to cooperate with similar latches on other circuit boards to permit a number of circuit boards to be stacked in a cabinet.

It is a more specific object of the present invention to provide a device that allows one or a multiplicity of circuit boards to be removed from a stack of circuit boards mounted in a cabinet to permit immediate access to the remaining circuit boards in the stack.

These and other objects are accomplished in accordance with the present invention by a latch device for removably securing circuit boards in a stack which includes a main body section comprising a front section including an upper horizontal plate with a hollow cylindrical member projecting upward from the middle thereof, two laterally spaced side members extending downwardly from the upper horizontal plate which terminate in spaced shoulders. The main body section also comprises a rear section including an upper horizontal plate, two spaced apart side members, projecting downwardly from the rear of the upper horizontal plate, which are joined to the side members of the front plate at the shoulders to form a flexure notch which permits the rear member to be flexed relative to the front member when removing circuit boards from the stack. The device further includes securing assembly means, constructed in the shape of a "J" with an aperture centered in the flat section thereof and pin assembly means which includes a shaft having a flat plate forming a head on the top side of the shaft and flexible expandable fingers forming the bottom portion of the shaft.

The latch device is secured to a circuit board by inserting the cylindrical member of the front section of the main body section through a pre-drilled hole in a circuit board so that the main body section is positioned on the bottom of the circuit board. The aperture of the securing assembly means is positioned over the cylindrical member which projects through to the top of the circuit board. A conventional lock nut is employed to fix the main body section and the securing means to the circuit board. The pin assembly means is inserted into the hollow cylindrical member, the fingers of the pin assembly yielding inward to pass through the inside diameter of the cylindrical member and then expanding to a diameter greater than the diameter of the cylindrical member to prevent the pin assembly from falling out of the main body section if the latch device is inverted. When the circuit boards are vertically stacked in a cabinet, the shoulder of the front section of the main body section of a circuit board engages the securing assembly means similarly mounted on a circuit board immediately below it. In this manner, a multiplicity of circuit boards are stacked in a cabinet.

To disengage any number of circuit board in a stack, downward axial pressure is placed on the head of the uppermost pin assembly means and a gentle upward pressure is exerted on the upper horizontal plate of the latch device mounted on the lowermost circuit board desired to be removed. This causes the spaced shoulders of the main body section of the latch device to disengage from the securing assembly means mounted on the circuit board immediately below the board desired to be removed, so that the lowermost circuit board, together with all circuit boards between the lowermost circuit board desired to be removed and the top circuit board are free to be removed from the stack.

These and other objects of the present invention will become more apparent to a worker skilled in the art upon reading the following detailed description taken in conjunction with the accompanying drawings.

FIG. 1 is a side elevated view showing a portion of an electronics cabinet with four stacked circuit boards mounted in the cabinet using the latch devices of the invention and also showing a latch device of the invention being activated to permit the top two boards of the stack to be disengaged for removal from the cabinet;

FIG. 2 is a partial rear view of the stack of circuit boards shown in FIG. 1 showing two of the latch devices of the invention, each assembled to a circuit board;

FIG. 3 is a sectional view taken along line 3—3 of FIG. 2 and showing three of the inventive latch devices;

Figure 5:
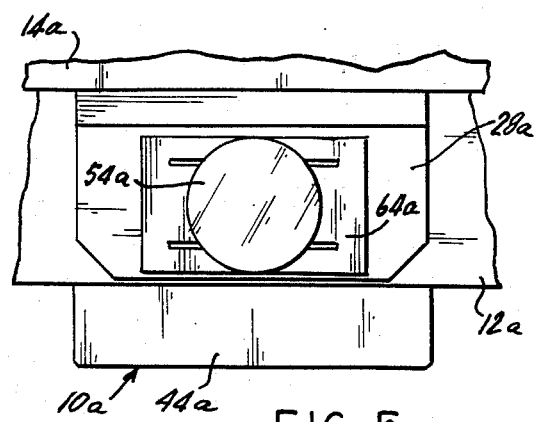
Figure 6:
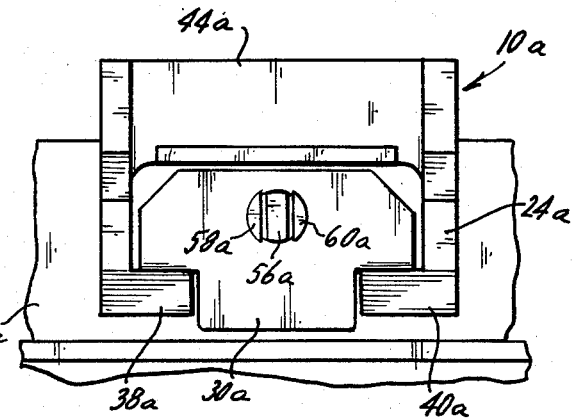
Figure 7:
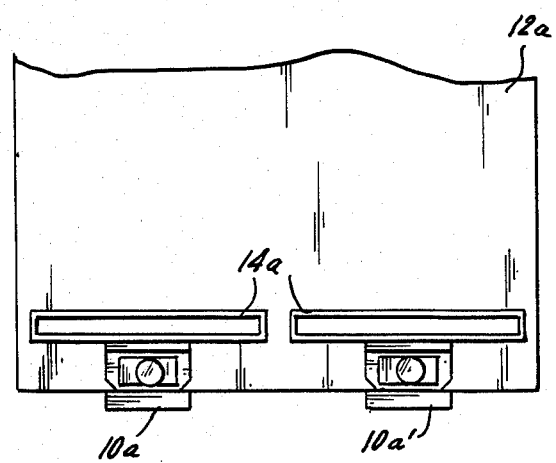
Figure 8:
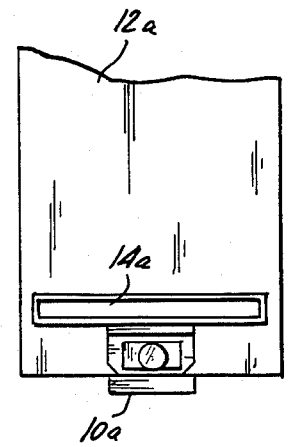

FIG. 5 is a top view of the inventive latch device assembled to a circuit board;

FIG. 6 is a bottom view of the inventive latch device assembled to a circuit board;

FIG. 7 is a top view showing the spacing of two of the inventive latch devices assembled to a wide circuit board to be installed into a stack; and, FIG. 8 is a top view showing one of the inventive latch devices assembled to a narrow circuit board to be assembled into a stack.

Referring to FIGS. 1–6, latch devices 10a–10d are secured to respective circuit boards 12a–12d in a stack of circuit boards, adjacent to electrical connectors 14a–14d. Circuit boards 12a–12d are held in position in an electronics cabinet, for example, by having the front ends 16a–16d of circuit boards 12a–12d engaged in notched sections 20a–20d of a terminal block 22 (FIG. 1). Latch devices 10a–10d permit any number of circuit boards to be stacked in a cabinet and permit one or a multiplicity of circuit boards to be readily removed from the cabinet to permit access to the remaining circuit boards or permit one or a group of damaged circuit boards to be easily replaced.

Figure 4:
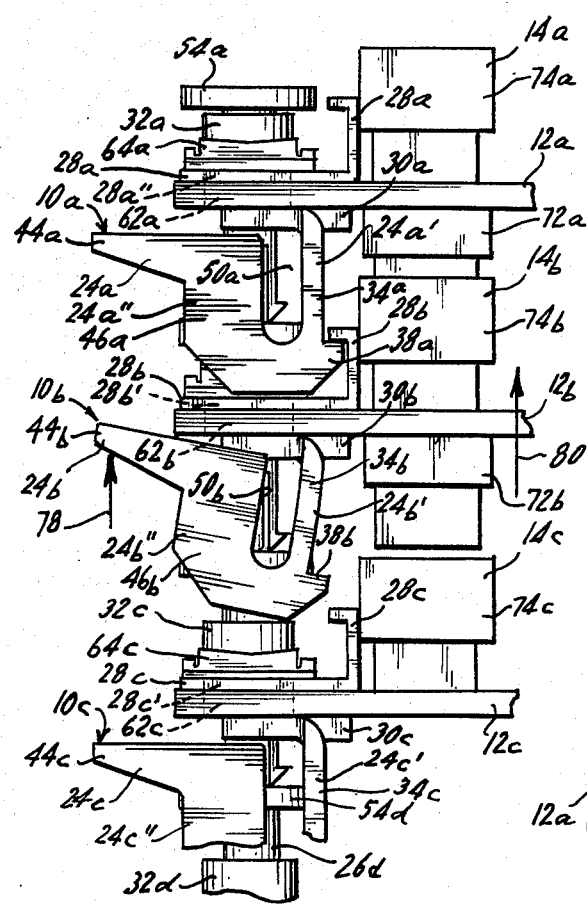
FIG. 4 is an enlarged partial side view of the upper portion of the stack of circuit boards shown in FIG. 1 with the second latch device shown in the disengaged position, the second circuit board disengaged from the third circuit board in preparation for removing the top two circuit boards from the stack.

Latch devices 10a–10d include main body sections 24a–24d, pin assemblies 26a–26d and securing assemblies 28a–28d formed with apertures 28a'–28d' (FIGS. 3, 4). Main body sections 24a–24d are preferably molded of flexible plastic, such as nylon or a polycarbonate material and include front sections 24a'–24d' (FIG. 4) comprising flat upper plates 30a–30d formed with hollow cylindrical members 32a–32d projecting upwards (FIG. 3) through circuit boards 12a–12d and two laterally spaced side members 34a–34d, 36a–36d (FIGS. 3, 4) projecting downwardly from opposite sides of flat upper plates 30a–30d proximate the front end thereof and terminating at shoulders 38a–38d, 40a–40d respectively. Main body sections 24a–24d further include rear sections 24a''–24d'' (FIG. 4) comprising flat top members 44a–44d and two spaced apart legs 46a–46d, 48a–48d (FIGS. 3, 4) downwardly projecting from flat top members 44a–44d and joined to spaced side members 34a–34d, 36a–36d of front sections 24a'–24d' at shoulders 38a–38d, 40a–40d to form flexure notches 50a–50d, 52a–52d between side members 34a–34d, 36a–36d and legs 46a–46d, 48a–48d respectively.

Pin assemblies 26a–26d are preferably molded of one piece plastic, similar to that of main body sections 24a–24d and include integrally formed flat heads 54a–54d, downwardly projecting shafts 56a–56d terminating in flexible fingers 58a–58d, 60a–60d (FIG. 3). Securing assemblies 28a–28d are formed in the shape of a "J" out of a rigid material, such as steel or a rigid plastic and are formed with apertures 28a'–28d' through which hollow cylindrical members 32a–32d are assembled as later described.

Referring now to FIGS. 3, 4, 7 and 8, circuit boards 12a–12d are predrilled with apertures 62a–62d (FIG. 3) in preparation for installation of latching devices 10a–10d. As seen in FIG. 7, two latching devices 10a and 10a' can be installed on wide circuit boards, while as shown in FIG. 8, only one latching device 10a is necessary on narrow circuit boards.

While the previous description is directed to latching devices 10a–10d installed on the stack of circuit boards depicted in FIGS. 1–4, the following description of installation and operation will be confined to latching device 10a, which is identical in all respects to latching devices 10b–10d.

Referring to FIGS. 1–6, latching device 10a is installed on circuit board 12a by inserting cylindrical member 32a through aperture 62a in circuit board 12a so that the main body section 24a of latch device 10a is underneath circuit board 12a. Securing assembly 28a (FIG. 4) is installed over the section of cylindrical member 32a protruding through aperture 62a in circuit board 12a. Securing assembly 28a and main body section 24a are secured to circuit board 12a by conventional lock nut 64a (FIG. 2). Pin assembly 26a is then installed in main body section 24a after the installation of main body section 24a and securing assembly 28a to circuit board 12a. Pin assembly 26a is installed in main body section 24a by pressing pin assembly 26a through cylindrical member 32a. Flexible fingers 58a, 60a of pin assembly 26a, when at rest have a diameter greater than the inside diameter of cylindrical member 32a (FIG. 6) to keep pin assembly 26a from falling out of main body section 24a when latching device 10a is inverted.

Referring now to FIG. 1, since securing assemblies 28a–28d are secured to circuit boards 12a–12d using main body sections 24a–24d, it is necessary to affix securing assembly 28e to the cabinet bottom 66 using a rigid fixed spacer 68 which is internally threaded and secured to cabinet bottom 66 by bolt 70 (not shown). This allows for securing assembly 28e to be fixed to cabinet bottom 66 without a main body section projecting below cabinet bottom 66.

Referring to FIGS. 1–4, to secure circuit board 12a to, for example, circuit board 12b, and assuming that circuit boards 12b, 12c and 12d are already stacked in the cabinet, the end 16a of circuit board 12a is inserted into notched section 20a of terminal block 22 and then the male portion 72a of connector 14a is inserted into the female portion 74b of connector 14b. As connector 14a is inserted into connector 14b, shoulders 38a, 40a of latch device 10a flex backwards away from connector 14b due to the flexible nature of side members 34a, 36a and flexure notch 50a and the engagement of shoulders 38b, 40b with lip 76b of securing assembly 28b (FIG. 4). When the male portion 72a of connector 14a is fully inserted into the female portion 74b of connector 14b, shoulders 38a, 40a snap under lip 76b of securing assembly 28b securing circuit board 12a to circuit board 12b and the rest of the stack of circuit boards. While latch devices 10a–10d provide the means to vertically secure circuit boards 12a–12d to each other, connectors 14a–14e provide lateral support to circuit boards 12a–12d.

One or a multiple of circuit boards can be removed from the stack of circuit boards. For example, to remove circuit boards 12a and 12b simultaneously from the stack 12a, 12b, 12c and 12d, in FIG. 1, a downward force is applied with the thumb of one hand on the uppermost pin head 54a of pin assembly 26a in the stack of circuit boards while simultaneously applying an upward force on the flat top member 44b as shown by arrow 78 in FIG. 4. In general pin assemblies 26a–26d are free to shift vertically in cylindrical members 32a–32d. By applying a downward force on pin head 54a, an axial force is transmitted through all of the pin assemblies 26a–26d in the stack of circuit boards to provide a fulcrum point about which to pivot the main body section 24a or 24b or 24c or 24d of the lowermost circuit board 12a or 12b or 12c or 12d desired to be removed. Applying an upward force on the flat top member 44b while applying a downward force on pin head 54a causes side members 34b, 36b to flex pulling shoulders 38b, 40b out from under lip 76c. Further upward force on flat top member 44b causes the male section 72b of connector 14b to disengage from the female section 74c of connector 14c thereby disengaging circuit boards 12a and 12b from the stack of circuit boards 12a, 12b, 12c and 12d as shown by arrow 80 (FIG. 4).

While what has been described is the presently preferred embodiment of the invention, it will be apparent to those skilled in the art that modifications and changes can be made to the invention while keeping within the spirit and scope thereof which is set forth in the appended claims.

I claim:

1. A latch device for removably mounting stacked circuit boards in a cabinet comprising a main body section, securing assembly means formed with an aperture and adapted to mount to said main body section and pin assembly means mounted for vertical movement through said main body section, said main body section comprising a forward body section including a flat upper plate formed with a projecting cylindrical member, two downwardly projecting laterally flexible side members integrally formed with said flat upper plate on the proximate end and each terminating at shoulder means on the distal end of said side members and a rear body section including a flat top member formed with two downwardly projecting laterally spaced legs terminating at said flexible side members of said forward body section at said shoulder means, said pin assembly means comprising a shaft member, a circular flat member formed at one end thereof and flexible fingers formed at the other end thereof, said main body section adapted to be mounted to a first circuit board by inserting said cylindrical member through an aperture in a first circuit board so that said cylindrical member projects through the top of said first circuit board, said securing assembly means adapted to be installed over said cylindrical section and secured with a conventional lock nut and said pin assembly adapted to be inserted through the top of said cylindrical section, said latch device adapted to be similarly assembled to multiple circuit boards to be stacked such that said shoulder means of a first main body section located on said first circuit board is adapted to engage said securing assembly installed on a second circuit board to secure said first circuit board to said second circuit board, said shoulder means of said first main body section further adapted to be disengaged from said securing assembly of said second circuit board by applying a downward axial force on said pin assembly associated with said latch device on said first circuit board while simultaneously applying an upward force on said flat top member of said rear body section mounted on said first circuit board causing said side members to flex and disengage said shoulder means of said first main body section from said securing assembly means on said second circuit board to disengage said first circuit board from said second circuit board.

2. A latch device as claimed in claim 1 wherein the diameter of said fingers of said pin assembly is larger than the inside diameter of said cylindrical member, so that once said pin assembly is installed in said cylindrical member, said pin assembly will not inadvertently fall out of said cylindrical member when said latch device is inverted.

* * * * *